US012328811B2

(12) United States Patent
Ki et al.

(10) Patent No.: US 12,328,811 B2
(45) Date of Patent: Jun. 10, 2025

(54) INSULATING MEMBER ARRANGEMENT STRUCTURE AND ELECTRONIC DEVICE INCLUDING THE SAME

(71) Applicant: Samsung Electronics Co., Ltd., Gyeonggi-do (KR)

(72) Inventors: Wooram Ki, Gyeonggi-do (KR); Dongcheol Park, Gyeonggi-do (KR); Yonghun Ji, Gyeonggi-do (KR); Yongsang Yun, Gyeonggi-do (KR)

(73) Assignee: Samsung Electronics Co., Ltd, Suwon-si (KR)

( * ) Notice: Subject to any disclaimer, the term of this patent is extended or adjusted under 35 U.S.C. 154(b) by 309 days.

(21) Appl. No.: 17/709,920

(22) Filed: Mar. 31, 2022

(65) Prior Publication Data

US 2023/0034551 A1 Feb. 2, 2023

Related U.S. Application Data

(63) Continuation of application No. PCT/KR2022/003439, filed on Mar. 11, 2022.

(30) Foreign Application Priority Data

Jul. 27, 2021 (KR) .................. 10-2021-0098746
Sep. 29, 2021 (KR) .................. 10-2021-0128844

(51) Int. Cl.
*H05K 1/18* (2006.01)
*H04M 1/02* (2006.01)
(Continued)

(52) U.S. Cl.
CPC ........ *H05K 1/0218* (2013.01); *H04M 1/0277* (2013.01); *H05K 1/05* (2013.01);
(Continued)

(58) Field of Classification Search
CPC ........ H05K 1/0218; H05K 1/05; H05K 1/118; H05K 1/189; H05K 2201/0929; H04M 1/0277
(Continued)

(56) References Cited

U.S. PATENT DOCUMENTS 6,713,685 B1  3/2004  Cotton
10,971,809 B2  4/2021  Shin et al.
(Continued)

FOREIGN PATENT DOCUMENTS

JP  2005-150047 A  6/2005
JP  2009-38796 A  2/2009
(Continued)

OTHER PUBLICATIONS

International Search Report dated Jun. 16, 2022.
Written Opinion dated Jun. 16, 2022.

*Primary Examiner* — Binh B Tran
(74) *Attorney, Agent, or Firm* — Cha & Reiter, LLC

(57) ABSTRACT

An electronic device is disclosed, including: a housing including a first surface, a second surface parallel to the first surface, and a side surface surrounding a space formed between the first surface and the second surface, a first printed circuit board (PCB) disposed on the first surface of the housing, a second PCB disposed on the first surface of the housing and spaced apart from the first PCB, a flexible printed circuit board (FPCB) connecting the first PCB and the second PCB, a conductive sheet disposed on the second surface of the housing and spaced apart from the first PCB, the second PCB, and the FPCB, and an insulating member disposed on one surface of the FPCB and contacting the conductive sheet.

20 Claims, 8 Drawing Sheets

(51) Int. Cl.
*H05K 1/02* (2006.01)
*H05K 1/05* (2006.01)
*H05K 1/11* (2006.01)

(52) U.S. Cl.
CPC ............. *H05K 1/118* (2013.01); *H05K 1/189* (2013.01); *H05K 2201/0929* (2013.01)

(58) Field of Classification Search
USPC ........................................................ 361/818
See application file for complete search history.

(56) References Cited

U.S. PATENT DOCUMENTS

| | | | | |
|---|---|---|---|---|
| 2003/0025668 | A1* | 2/2003 | Lin | G06F 3/0221 345/169 |
| 2003/0222282 | A1* | 12/2003 | Fjelstad | H01L 23/49805 257/200 |
| 2009/0033634 | A1 | 2/2009 | Shin et al. | |
| 2013/0242513 | A1* | 9/2013 | Masuda | H05K 1/14 361/752 |
| 2014/0284070 | A1* | 9/2014 | Ng | B25F 5/00 173/2 |
| 2018/0131087 | A1 | 5/2018 | Kim et al. | |
| 2018/0277934 | A1* | 9/2018 | Kim | H01Q 1/38 |
| 2019/0087037 | A1 | 3/2019 | Huang et al. | |
| 2021/0296723 | A1* | 9/2021 | Yamada | H01M 50/298 |
| 2021/0298186 | A1* | 9/2021 | Yoo | H05K 5/0226 |
| 2021/0329784 | A1 | 10/2021 | Park et al. | |

FOREIGN PATENT DOCUMENTS

| | | |
|---|---|---|
| KR | 2003-0074545 A | 9/2003 |
| KR | 10-2009-0060477 A | 6/2009 |
| KR | 10-1466605 B1 | 11/2014 |
| KR | 10-2018-0051173 A | 5/2018 |
| KR | 10-2020-0019534 A | 2/2020 |

\* cited by examiner

INSULATING MEMBER ARRANGEMENT STRUCTURE AND ELECTRONIC DEVICE INCLUDING THE SAME

CROSS-REFERENCE TO RELATED APPLICATION(S)

This application is a continuation of International Application No. PCT/KR2022/003439, filed on Mar. 11, 2022, which claims priority to Korean Patent Application No. 10-2021-0098746, filed on Jul. 27, 2021 and Korean Patent Application No. 10-2021-0128844, filed on Sep. 29, 2021 in the Korean Intellectual Property Office, the disclosures of which are herein incorporated by reference.

BACKGROUND

Technical Field

Certain embodiments of the disclosure relate to an insulating member arrangement structure and an electronic device including the same.

Description of Related Art

In notebook personal computers and other such portable devices, printed circuit boards (PCB) may be used. In some instances, the PCB is sub-divided. For example, a PCB may be divided into a sub PCB having a long term evolution (LTE) module portion, and a main PCB portion including the central processing unit (CPU), wherein much of the heat is generated. Furthermore, a flexible PCB (FPCB) may be disposed between the sub PCB and the main PCB to transmit signal and power between the two PCB portions.

SUMMARY

The FPCB for electrically connecting the sub PCB and the main PCB may be disposed adjacent to a conductive sheet installed to improve heat dissipation. As the FPCB and the conductive sheet are disposed adjacent to each other, noise generated by electrical signals and power suppled to components of the FPCB may affect the conductive sheet. This "noise coupling" of electrical noise generated by the FPCB may deteriorate radio frequency (RF) communication performance of the electronic device. In addition, due to the noise coupling, the conductive sheet may actually begin emitting electro-magnetic interference (EMI) noise, which disrupt the normal operations of surrounding electronic equipment.

According to certain embodiments of the disclosure, an electronic device may include a housing including a housing including a first surface, a second surface parallel to the first surface, and a side surface surrounding a space formed between the first surface and the second surface, a first printed circuit board (PCB) disposed on the first surface of the housing, a second PCB disposed on the first surface of the housing and spaced apart from the first PCB, a flexible printed circuit board (FPCB) connecting the first PCB and the second PCB, conductive sheet disposed on the second surface of the housing and spaced apart from the first PCB, the second PCB, and the FPCB, and an insulating member disposed on one surface of the FPCB and contacting the conductive sheet.

According to certain embodiments of the disclosure, an insulting member arrangement structure and/or a shielded electronic device may include: a flexible printed circuit board (FPCB), a conductive sheet spaced apart from one surface of the FPCB, and an insulating member disposed on the one surface of the FPCB and contacting with the conductive sheet.

In the insulating member arrangement structure for an electronic device, according to certain embodiments of the disclosure, the insulating member is disposed on one surface of the to prevent generation of noise from signal and power components of the FPCB, and prevent noise coupling of the FPCB to the heat dissipating conductive sheet. The insulating member arrangement structure and the electronic device including the same, according to certain embodiments of the disclosure, can reduce noise coupling and thereby prevent degradation of RF communication performance and the emission of EMI noise.

DETAILED DESCRIPTION

Figure 1:
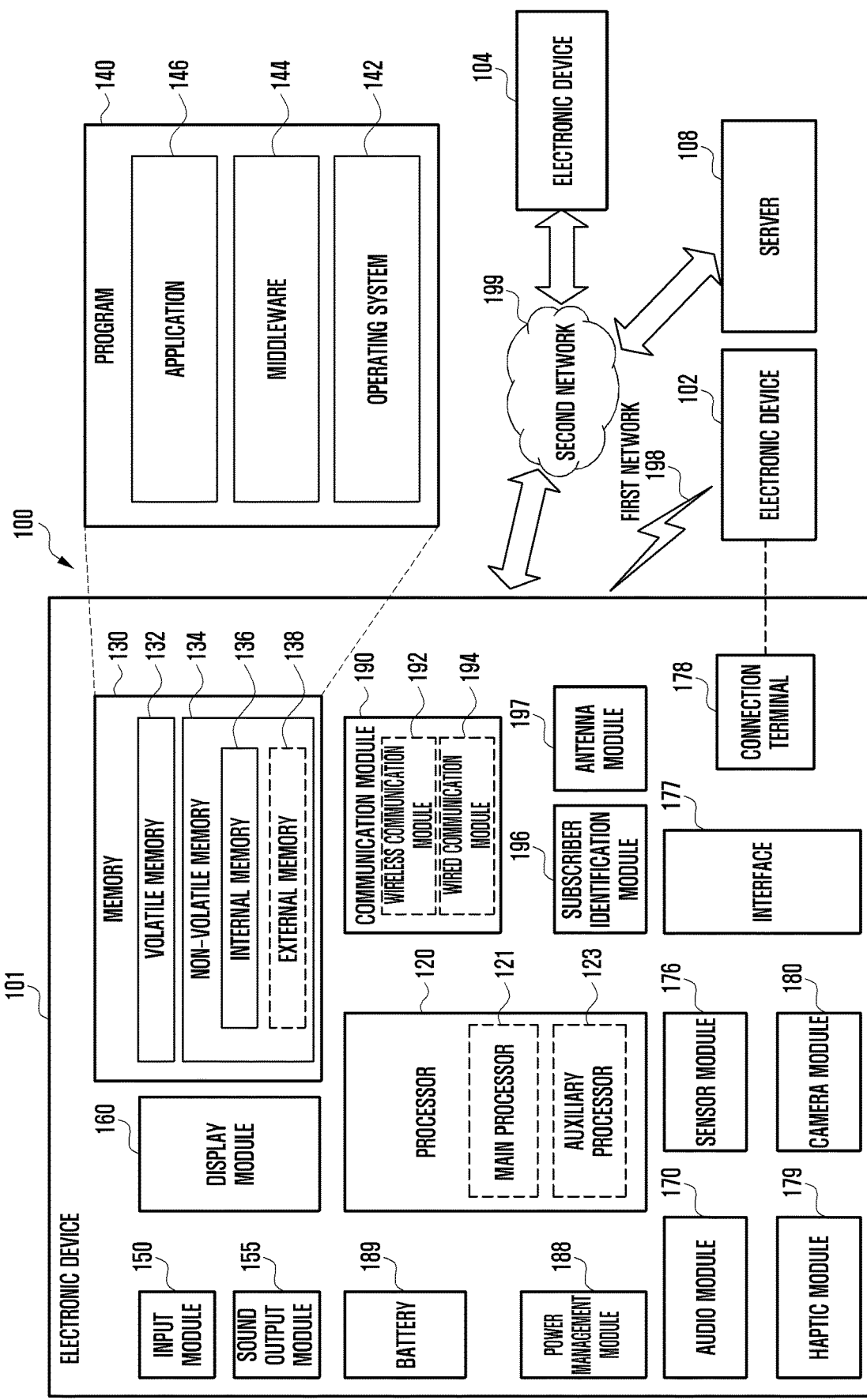
FIG. 1 is a block diagram illustrating an electronic device in a network environment according to certain embodiments.

FIG. 1 is a block diagram illustrating an electronic device in a network environment according to certain embodiments. Referring to FIG. 1, an electronic device 101 in a network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one of the components (e.g., the connecting terminal 178) may be omitted from the electronic device 101, or one or more other components may be added in the electronic device 101. In some embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to an embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted Boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to an embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the millimeter(mm) Wave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element implemented using a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to certain embodiments, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra-low-latency services using, e.g., distributed computing or mobile edge computing. In another embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

In describing the electronic device 101 according to certain embodiments of the disclosure, a first direction may refer to an x-axis direction. In addition, a second direction may refer to a y-axis direction, and a third direction may refer to a z-axis direction. The first direction (the x-axis direction) and the second direction (the y-axis direction) may be orthogonal to each other. The third direction (the z-axis direction) may be a direction orthogonal to a plane formed in the first direction (the x-axis direction) and the second direction (the y-axis direction).

Figure 2A:
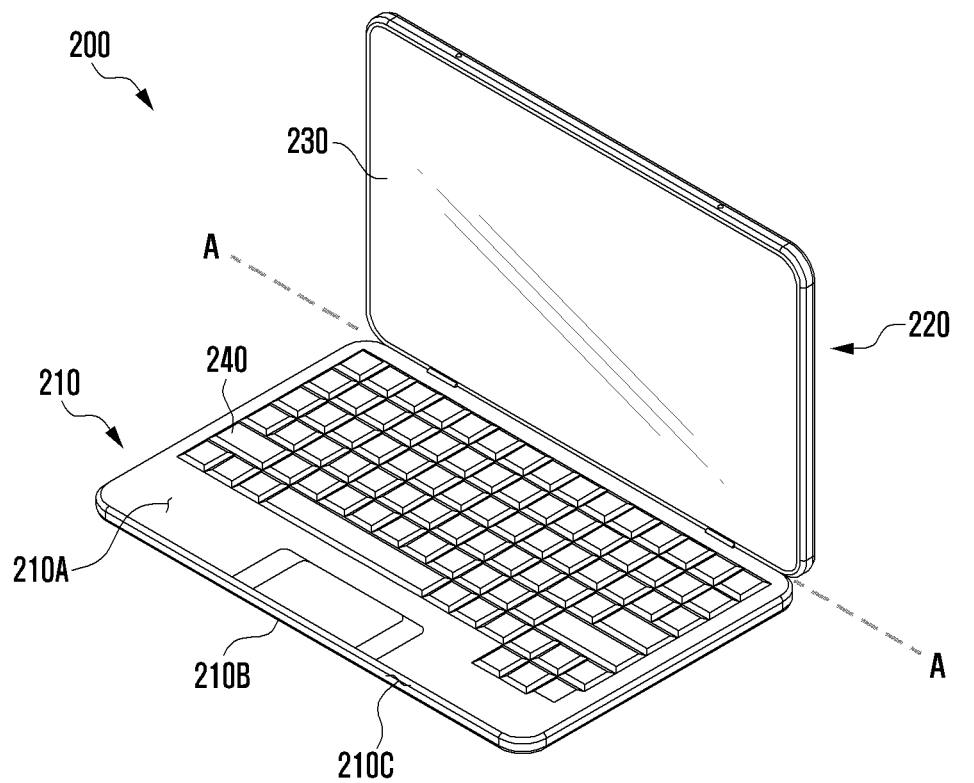
FIGS. 2A and 2B are perspective views illustrating electronic devices according to certain embodiments of the disclosure.
Figure 2B:
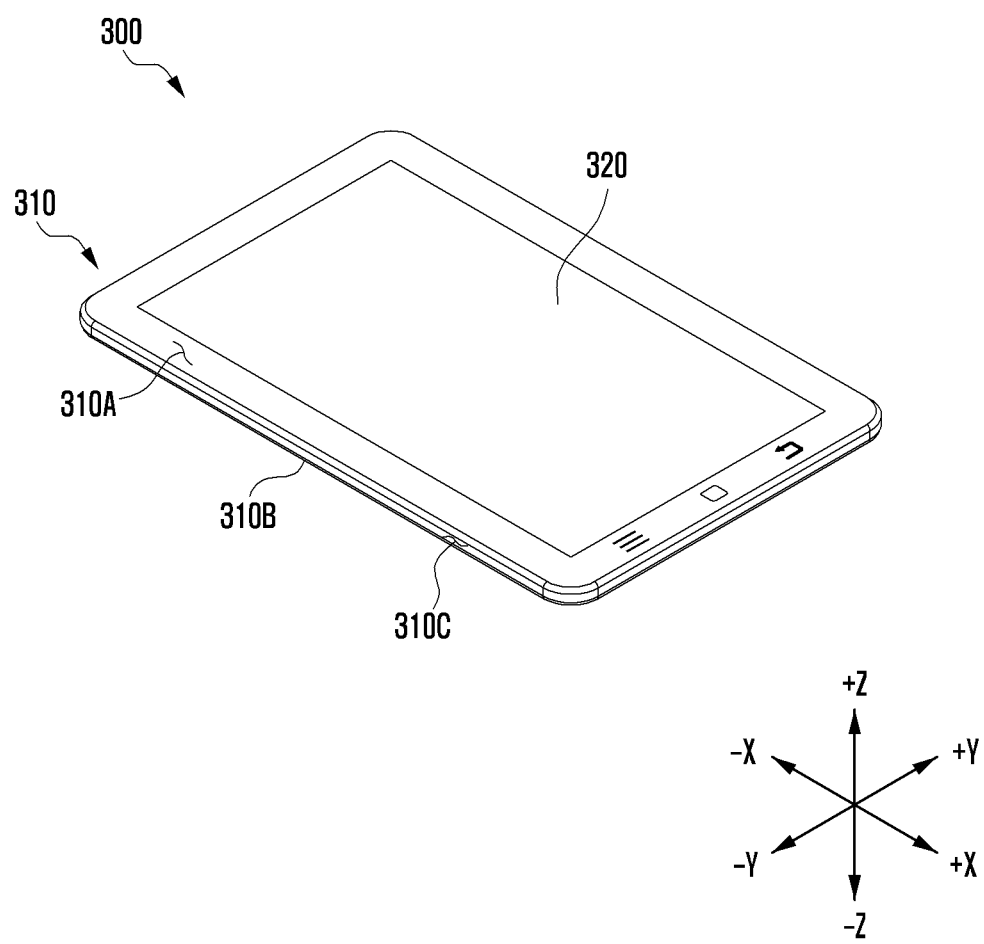

FIGS. 2A and 2B are perspective views illustrating electronic devices 200 and 300 according to certain embodiments of the disclosure.

FIG. 2A is a perspective view illustrating the electronic device 200 in the form of a notebook PC according to certain embodiments of the disclosure.

FIG. 2B is a perspective view illustrating the electronic device 300 in the form of a tablet PC according to certain embodiments of the disclosure.

According to certain embodiments of the disclosure, the electronic device 101 (see FIG. 1) may include the electronic device 200, such as a notebook personal computer (PC) as illustrated in FIG. 2A. The electronic device 200 may include a first housing 210 and a second housing 220 that are foldable to face each other. For example, the first housing 210 and the second housing 220 are foldable to face each other according to a folding axis (e.g., the axis A-A illustrated in FIG. 2A) of the electronic device 200. In some embodiments, the electronic device 200 may be folded such that a keyboard 240 disposed on the first housing 210 and a display module 230 (e.g., the display module 160 in FIG. 1) disposed on the second housing 220 face each other.

In an embodiment, the first housing 210 and the second housing 220 are disposed on both sides about the folding axis (e.g., the axis A-A illustrated in FIG. 2A) of the electronic device 200 and may have an overall symmetrical shape with respect to the folding axis. In another embodiment, the first housing 210 and the second housing 220 may have an asymmetric shape with respect to the folding axis of the electronic device 200. Depending on whether the electronic device 200 is in an unfolded state, a folded state, or an intermediate state, an angle or distance between the first housing 210 and the second housing 220 may vary.

According to certain embodiments of the disclosure, the electronic device 101 (see FIG. 1) may include the electronic device 300 in the form of a tablet PC as illustrated in FIG. 2B. With reference to FIG. 2B, the electronic device 300 in the form of a tablet PC may include a first housing 310. The first housing 310 may include a display module 320 at least in part.

With reference to FIGS. 2A and 2B, the first housing 210 or 310 according to an embodiment may have a first surface 210A or 310A, a second surface 210B or 310B, and a side surface 210C or 310C surrounding a space between the first surface 210A or 310A and the second surface 210B or 310B. In the first housing 210 or 310, the first surface 210A or 310A and the second surface 210B or 310B may be formed in parallel.

In an embodiment, the side surface 210C or 310C of the first housing 210 or 310 may be manufactured separately from the first surface 210A or 310A of the first housing 210 or 310 and the second surface 210B or 310B of the first housing 210 or 310 and then combined with at least one of the first surface 210A or 310A of the first housing 210 or 310 and the second surface 210B or 310B of the first housing 210 or 310. For example, in the first housing 210 or 310, the first surface 210A or 310A, the second surface 210B or 310B, and the side surface 210C or 310C may be combined with each other in various ways (e.g., bonding through an adhesive, welding, bolting). In an embodiment, the side surface 210C or 310C of the first housing 210 or 310 may be integrally formed with the first surface 210A or 310A or the second surface 210B or 310B. In FIG. 2A, the second housing 220 may have the same configuration as the first housing 210.

According to certain embodiments, various connector ports (not shown) may be included on the side surface 210C or 310C of the first housing 210 or 310. The connector port may include a connector port (e.g., a USB connector) for transmitting and receiving power and/or data to and from an external electronic device. In some embodiments, the connector port may also perform a function of transmitting and receiving an audio signal to and from an external electronic device, or may further include a separate connector port (e.g., an ear jack hole) for performing the function of transmitting and receiving an audio signal.

In certain embodiments, the first housing 210 or 310 and the second housing 220 may be formed of various materials. For example, they may be formed of a metal material and/or a non-metal material. The metal material may include an alloy containing aluminum, stainless steel (STS, SUS), iron, magnesium, titanium, or the like, and the non-metal material may include a synthetic resin, ceramic, or engineering plastic.

In certain embodiments, the first housing 210 or 310 and the second housing 220 may be manufactured in various methods. For example, they may be formed by a method such as injection molding or die casting.

The above-described shapes, materials, and forming methods of the first housing 210 or 310 and the second housing 220 are merely examples, and various changes can be made within a range that can be implemented by a person skilled in the art.

Figure 3:
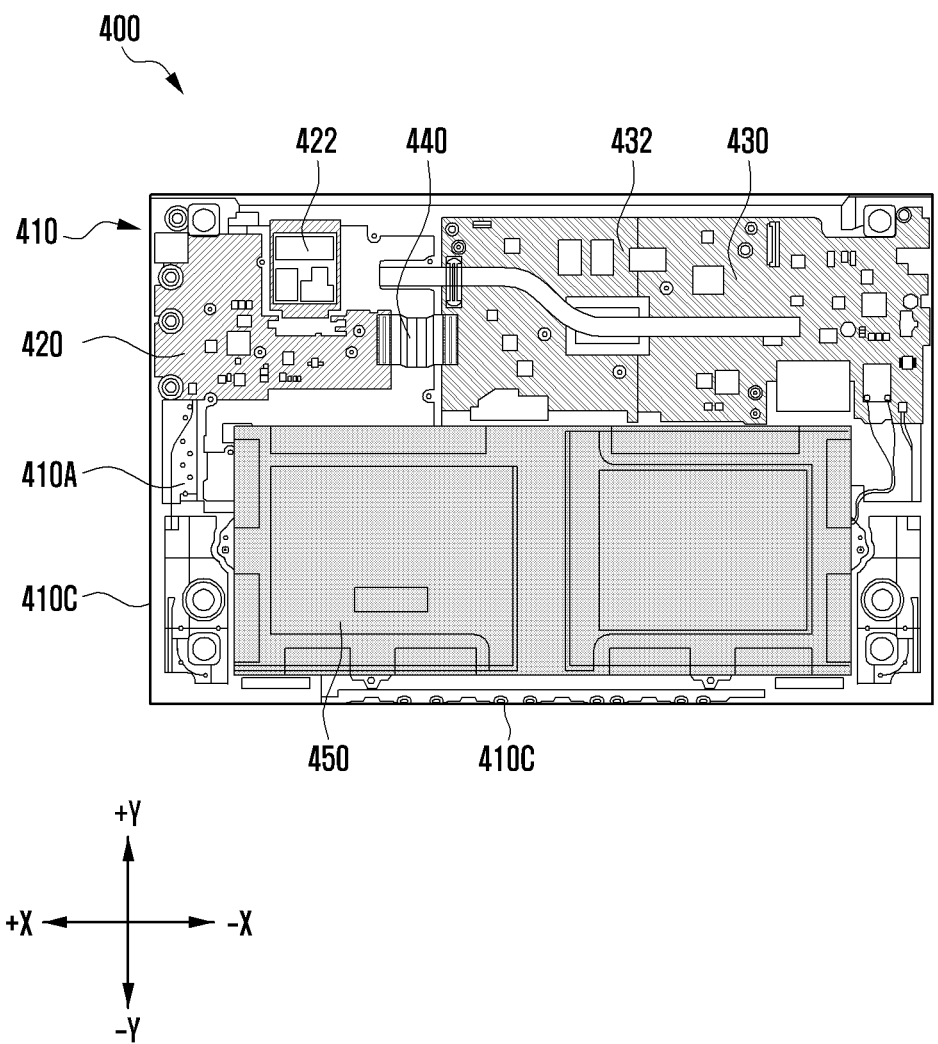
FIG. 3 is a diagram illustrating the interior of an electronic device according to certain embodiments of the disclosure.

FIG. 3 is a diagram illustrating the interior of an electronic device 400 according to certain embodiments of the disclosure.

In the following description, the electronic device 400 (e.g., the electronic device 101 in FIG. 1) according to certain embodiments of the disclosure may be the electronic device 200 (see FIG. 2A) of a notebook PC type including the first housing 210 and the second housing 220. The electronic device 400 (e.g., the electronic device 101 in FIG. 1) according to certain embodiments of the disclosure may be the electronic device 300 (see FIG. 2B) of a tablet PC type including the first housing 310. Hereinafter, in describing the electronic device 400 according to certain embodiments of the disclosure, a housing 410 may refer to the first housing 210 or 310.

The electronic device 400 according to certain embodiments of the disclosure may include the housing 410 (e.g., the first housing 210 or 310 in FIGS. 2A and 2B), a first printed circuit board 420, a second printed circuit board 430, a flexible printed circuit board 440, a conductive sheet 460 (see FIG. 4), an insulating member 470 (see FIG. 5), and/or a battery 450 (e.g., the battery 189 in FIG. 1).

According to certain embodiments, the first printed circuit board 420, the second printed circuit board 430, the flexible printed circuit board 440, and the battery 450 may be disposed inside the housing 410.

The battery 450 may supply power to at least one component of the electronic device 400 and may include, for example, a non-rechargeable primary cell, or a rechargeable secondary cell, or a fuel cell. At least a portion of the battery 450 may be disposed substantially on the same plane as the first printed circuit board 420 and the second printed circuit board 430. The battery 450 may be disposed integrally inside the electronic device 400. In another embodiment, the battery 450 may be disposed detachably from the electronic device 400.

According to certain embodiments, the battery 450 may be disposed to be spaced apart from a side surface 410C of the housing 410. The battery may be formed in a shape having a rectangular cross-section based on an x-y plane, but the shape is not limited thereto and various other shapes are possible.

According to certain embodiments, the battery 450 may have a length in the first direction (the x-axis direction) greater than a length in the second direction (the y-axis direction).

With reference to FIG. 3, in certain embodiments, the first printed circuit board 420 and the second printed circuit board 430 may be positioned to be spaced apart from the battery 450 in the second direction (the y-axis direction). The first printed circuit board 420 and the second printed circuit board 430 may be disposed on a first surface 410A of the housing 410 and may be disposed substantially on the same plane as at least a portion of the battery 450.

According to certain embodiments, the printed circuit boards 420 and 430 disposed inside the electronic device 400 may include the first printed circuit board 420 and the second printed circuit board 430. In certain embodiments, the larger the area of the printed circuit boards 420 and 430 disposed inside the electronic device 400, the higher the cost of manufacturing the printed circuit boards 420 and 430. Dividing the printed circuit board 420 and 430 into the first printed circuit board 420 and the second printed circuit board 430 may reduce the total area of the printed circuit boards 420 and 430, and thus the manufacturing cost of the printed circuit boards 420 and 430 can also be reduced.

According to certain embodiments, the processor 120 (not shown) and the memory 130 (not shown) may be mounted on at least one surface of the first and second printed circuit boards 420 and 430. The processor 120 (not shown) may include, for example, one or more of a central processing unit, an application processor, a graphic processing unit, an image signal processor, a sensor hub processor, or a communication processor. The memory 130 (not shown) may include, for example, a volatile memory or a non-volatile memory.

According to certain embodiments, the first printed circuit board 420 may be electrically connected to a communication module 422. Alternatively, the first printed circuit board 420 may include the communication module 422. The communication module 422 may enable the electronic device 400 to perform wireless communication. For example, the communication module 422 may include a long term evolution (LTE) module capable of transmitting/receiving an LTE signal.

When the electronic device 400 according to certain embodiments of the disclosure is operating, the communication module 422 included in or connected to the first printed circuit board 420 may generate heat, and the heat generated by the communication module 422 may be transferred to other regions of the electronic device 400.

According to certain embodiments, the second printed circuit board 430 may include a central processing unit (CPU) region 432. The CPU region 432 may include the CPU (not shown) that controls the electronic device 400 and performs an operation for the electronic device 400.

When the electronic device 400 according to certain embodiments of the disclosure is operating, the CPU region 432 may generate heat, and the heat generated by the CPU region 432 may be transferred to other regions of the electronic device 400.

Figure 4:
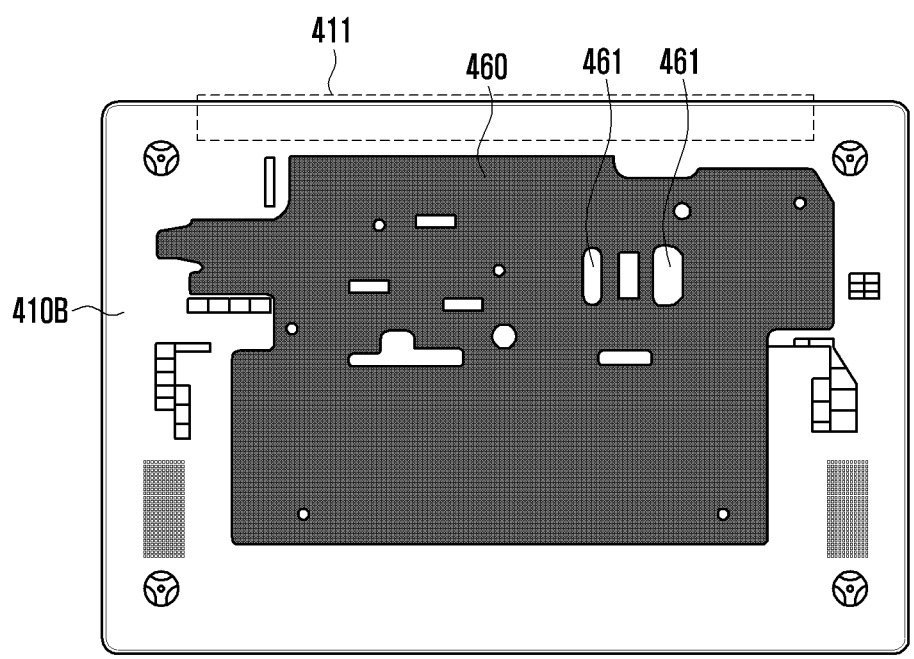
FIG. 4 is a diagram illustrating a second surface of a housing according to certain embodiments of the disclosure.

The electronic device 400 according to certain embodiments of the disclosure may include the conductive sheet 460 (see FIG. 4). The conductive sheet 460 (see FIG. 4) may diffuse heat generated by the first and second printed circuit boards 420 and 430 and thereby lower the temperature of the first and second printed circuit boards 420 and 430.

In certain embodiments, a lengthwise direction of the first and second printed circuit boards 420 and 430 refers to a direction in which the first and second printed circuit boards 420 and 430 are formed long, and a widthwise direction of the first and second printed circuit boards 420 and 430 refers to a direction in which the length is shorter than the lengthwise direction. In the lengthwise direction of the first and second printed circuit boards 420 and 430, the length of the first printed circuit board 420 may be smaller than the length of the second printed circuit board 430. In the widthwise direction of the first and second printed circuit boards 420 and 430, the length of the first printed circuit board 420 may be smaller than the length of the second printed circuit board 430.

With reference to FIG. 3, in certain embodiments, the lengthwise direction of the first and second printed circuit boards 420 and 430 may refer to the first direction (the x-axis direction), and the widthwise directions of the first and second printed circuit boards 420 and 430 may refer to the second direction (the y-axis direction). In the first direction (the x-axis direction), the length of the first printed circuit board 420 may be smaller than that of the second printed circuit board 430. In the second direction (the y-axis direction), the length of the first printed circuit board 420 may be smaller than that of the second printed circuit board 430.

According to certain embodiments, the first printed circuit board 420 and the second printed circuit board 430 may be spaced apart from each other in the first direction (e.g., the x-axis direction). The flexible printed circuit board 440 may be disposed in a space formed between the first printed circuit board 420 and the second printed circuit board 430. For example, the flexible printed circuit board 440 may be positioned within at least a portion of the space defined between the first printed circuit board 420 and the second printed circuit board 430.

According to certain embodiments, the flexible printed circuit board 440 may be arranged such that one end thereof is positioned at the first printed circuit board 420, and the opposite end thereof is positioned at the second printed circuit board 430.

According to certain embodiments, the flexible printed circuit board 440 may electrically connect the first printed circuit board 420 and the second printed circuit board 430. The flexible printed circuit board 440 may include a conductive layer (not shown) and a non-conductive layer (not shown). The conductive layer (not shown) may have a conductive material. For example, the conductive layer (not shown) may be formed using copper. The non-conductive layer (not shown) may have a non-conductive material. For example, the non-conductive layer (not shown) may include polyimide, which is an insulating material.

According to certain embodiments, the first printed circuit board 420 may be electrically connected to the second printed circuit board 430 through the conductive layer (not shown) included in the flexible printed circuit board 440.

According to certain embodiments, the flexible printed circuit board 440 may include a flexible material. The flexible printed circuit board 440 including the flexible material may have a bent shape at least in part.

In certain embodiments, a lengthwise direction of the flexible printed circuit board 440 refers to a direction in which the flexible printed circuit board 440 is formed long, and a widthwise direction refers to a direction in which the length is shorter than the lengthwise direction. The flexible printed circuit board 440 may be formed to have a length in the lengthwise direction greater than a length in the widthwise direction.

With reference to FIG. 3, in certain embodiments, the lengthwise direction of the flexible printed circuit board 440 may refer to the first direction (the x-axis direction), and the widthwise directions of the flexible printed circuit board 440 may refer to the second direction (the y-axis direction). The flexible printed circuit board 440 may be formed to have a length in the first direction (the x-axis direction) greater than a length in the second direction (the y-axis direction).

According to certain embodiments, one side of the first printed circuit board 420 may be connected to one end of the flexible printed circuit board 440, and one side of the second printed circuit board 430 may be connected to the opposite end of the flexible printed circuit board 440.

According to certain embodiments, in the widthwise direction, the length of the flexible printed circuit board 440 may be smaller than the length of the first printed circuit board 420. For example, with reference to FIG. 3, in the second direction (the y-axis direction), the length of one end of the flexible printed circuit board 440 may be smaller than the length of one side of the first printed circuit board 420.

According to certain embodiments, in the widthwise direction, the length of the flexible printed circuit board 440 may be smaller than the length of the second printed circuit board 430. For example, with reference to FIG. 3, in the second direction (the y-axis direction), the length of the opposite end of the flexible printed circuit board 440 may be smaller than the length of one side of the second printed circuit board 430.

FIG. 4 is a diagram illustrating a second surface 410B of a housing 410 according to certain embodiments of the disclosure.

With reference to FIG. 4, in certain embodiments, the conductive sheet 460 may be disposed on at least a portion of the second surface 410B of the housing 410. The conductive sheet 460 may be adhered to (e.g., affixed to) the second surface 410B of the housing 410 through an adhesive material.

The conductive sheet 460 according to certain embodiments of the disclosure may be disposed to be spaced apart from the first printed circuit board 420 (see FIG. 5), the second printed circuit board 430 (see FIG. 5), and the flexible printed circuit board 440 (see FIG. 5), which are disposed on the first surface 410A (see FIG. 5) of the housing 410. For example, the first printed circuit board 420 (see FIG. 5), the second printed circuit board 430 (see FIG. 5), and the flexible printed circuit board 440 (see FIG. 5) may be positioned to be spaced apart from the conductive sheet 460 in the third direction (the z-axis direction, see FIG. 5).

According to certain embodiments, the conductive sheet 460 may diffuse high-temperature heat generated from a heating source to other, relatively low-temperature positions inside the electronic device 400, thereby lowering the temperature of the heating source. For example, the conductive sheet 460 may diffuse heat generated from the first printed circuit board 420 and/or the second printed circuit board 430 to other regions and thereby reduce the temperature of the first printed circuit board 420 and the second printed circuit board 430.

The conductive sheet 460 according to certain embodiments of the disclosure may use a heat diffusion method and thus not require a separate driving region. Compared to a heat dissipation device using a separate driving region, the conductive sheet 460 may lower power consumption of the electronic device 400.

The conductive sheet 460 according to certain embodiments of the disclosure may be formed of various materials. For example, the conductive sheet 460 may include a graphite sheet or a metal thin film sheet. The graphite sheet may be used as a material forming the conductive sheet 460 because it is lightweight and may have thermal conductivity greater than copper.

According to certain embodiments, the conductive sheet 460 may have a conductive sheet opening 461 formed at least in part. The conductive sheet opening 461 prevents electrical components, disposed on the first and second printed circuit boards 420 and 430 and positioned adjacent to the conductive sheet 460, from interfering with the conductive sheet 460. For example, the conductive sheet opening 461 may be formed at positions overlapping with a first connector 421 (see FIG. 6) disposed on one surface of the first printed circuit board 420 and a second connector 431 (see FIG. 6) disposed on one surface of the second printed circuit board 430, thereby preventing the conductive sheet 460 from interfering with the first and second connectors 421 and 431. According to an embodiment, at least a portion of the conductive sheet opening 461 may be disposed to overlap with the insulating member 470.

The conductive sheet 460 according to certain embodiments of the disclosure may include a plurality of conductive sheet openings 461. The plurality of conductive sheet openings 461 may be formed at positions that overlap with electrical components that may interfere with the conductive sheet 460. The plurality of conductive sheet openings 461 may prevent the conductive sheet 460 from interfering with other electrical components inside the electronic device 400.

The second surface 410B of the housing 410 according to an embodiment may correspond to the second surface 210B of the housing 210 of the electronic device 200 in the form of a notebook PC shown in FIG. 2A or the second surface 310B of the housing 310 of the electronic device 300 in the form of a tablet PC shown in FIG. 2B.

With reference to FIG. 4, the second surface 410B of the housing 410 according to an embodiment may include a hinge region 411. When the second surface 410B of the housing 410 according to an embodiment corresponds to the second surface 210B of the housing 210 of the electronic device 200 in the form of a notebook PC shown in FIG. 2A, the second surface 410B of the housing 410 may include a hinge structure (not shown) for connection to the second housing 220 (see FIG. 2A). This hinge structure (not shown) may be disposed in the hinge region 411.

Figure 5:
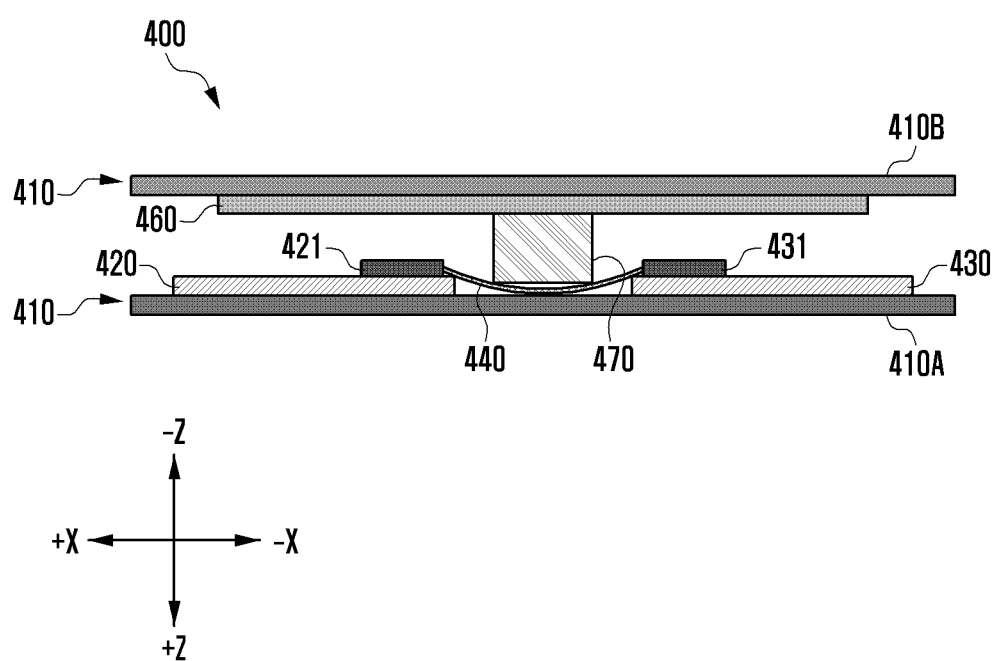
FIG. 5 is a conceptual diagram illustrating an arrangement of an electronic device according to certain embodiments of the disclosure.

FIG. 5 is a conceptual diagram illustrating an arrangement of an electronic device 400 according to certain embodiments of the disclosure.

The electronic device 400 according to certain embodiments of the disclosure may include the housing 410, the first printed circuit board 420, the second printed circuit board 430, the flexible printed circuit board 440, the conductive sheet 460, the first connector 421, the second connector 431, and/or the insulating member 470.

According to certain embodiments, the first printed circuit board 420 and the second printed circuit board 430 may be disposed in at least a portion of the housing 410. For example, the first printed circuit board 420 and the second printed circuit board 430 may be disposed on the first surface 410A of the housing 410. According to an embodiment, the housing 410 may include an inner housing (not shown) for supporting the first printed circuit board 420 and/or the second printed circuit board 430, and the inner housing (not shown) may be formed integrally with or separately from the first surface 410A of the housing 410. For example, at least a portion of the inner housing (not shown) may be formed of a conductive plate.

According to certain embodiments, the first printed circuit board 420 may be disposed to be spaced apart from the second printed circuit board 430. For example, the first printed circuit board 420 may be positioned to be spaced apart from the second printed circuit board 430 in the first direction (the x-axis direction).

According to certain embodiments, the flexible printed circuit board 440 may be disposed in a space formed between the first printed circuit board 420 and the second printed circuit board 430. The flexible printed circuit board 440 may electrically connect the first printed circuit board 420 and the second printed circuit board 430 to transmit signals and power. The first and second printed circuit boards 420 and 430 may be electrically connected to each other through a conductive layer (not shown) included in the flexible printed circuit board 440.

According to certain embodiments, the flexible printed circuit board 440 may be connected to the first printed circuit board 420 at one end thereof and connected to the second printed circuit board 430 at the opposite end thereof. In order for the flexible printed circuit board 440 to be connected to the first and second printed circuit boards 420 and 430, the first connector 421 may be disposed at the one end of the flexible printed circuit board 440, and the second connector 431 may be disposed at the opposite end of the flexible printed circuit board 440.

According to certain embodiments, the first connector 421 may be disposed on one surface of the first printed circuit board 420. The first connector 421 may electrically connect the first printed circuit board 420 and the flexible printed circuit board 440.

According to certain embodiments, the second connector 431 may be disposed on one surface of the second printed circuit board 430. The second connector 431 may electrically connect the second printed circuit board 430 and the flexible printed circuit board 440.

According to certain embodiments, in the lengthwise direction of the flexible printed circuit board 440, the length of the flexible printed circuit board 440 may be greater than a spaced distance between the first printed circuit board 420 and the second printed circuit board 430. For example, with reference to FIG. 5, in the first direction (the x-axis direction), the length of the flexible printed circuit board 440 may be greater than a distance between the first and second printed circuit boards 420 and 430. The flexible printed circuit board 440 may be formed to be bent in the third direction (the z-axis direction) between the first and second printed circuit boards 420 and 430.

According to certain embodiments, the conductive sheet 460 may be disposed on the second surface 410B of the housing 410. The conductive sheet 460 may be adhered and fixed to the second surface 410B of the housing 410 through an adhesive material.

According to certain embodiments, the conductive sheet 460 may be spaced apart from the first printed circuit board 420, the second printed circuit board 430, and the flexible printed circuit board 440, which are disposed on the first surface 410A of the housing 410. For example, with reference to FIG. 5, the first printed circuit board 420, the second printed circuit board 430, and the flexible printed circuit board 440 may be positioned to be spaced apart from the conductive sheet 460 in the third direction (the z-axis direction).

According to certain embodiments, the insulating member 470 may be disposed on one surface of the flexible printed circuit board 440. For example, with reference to FIG. 5, the flexible printed circuit board 440 may be positioned in the third direction (the z-axis direction) with respect to the insulating member 470.

According to certain embodiments, the insulating member 470 may be in contact with the conductive sheet 460. For example, with reference to FIG. 5, the insulating member 470 may be positioned in the third direction (the z-axis direction) with respect to the conductive sheet 460 and be in contact with the conductive sheet 460.

According to an embodiment, the insulating member 470 may be adhered to the conductive sheet 460 through an adhesive member (not shown). For example, the adhesive member (not shown) may include an adhesive tape (not shown), and the insulating member 470 may be adhered to the conductive sheet 460 through the adhesive tape (not shown).

In certain embodiments, an upper surface of the insulating member 470 refers to a surface of the insulating member 470 facing toward the negative z-axis direction, and a lower surface of the insulating member 470 refers to a surface of the insulating member 470 facing toward the positive z-axis direction. The insulating member 470 may be in contact with the conductive sheet 460 on the upper surface thereof and be in contact with the flexible printed circuit board 440 on the lower surface thereof. According to an embodiment, the upper surface of the insulating member 470 may be disposed at a position that overlaps with at least a portion of the conductive sheet opening 461 (see FIG. 4) formed in the conductive sheet 460.

The insulating member 470 according to certain embodiments of the disclosure may allow a gap to be formed between the flexible printed circuit board 440 and the conductive sheet 460.

If the electronic device 400 according to certain embodiments of the disclosure does not include the insulating member 470, the flexible printed circuit board 440 may be bent in a direction toward the conductive sheet 460. For example, if the electronic device 400 does not include the insulating member 470, the flexible printed circuit board 440 may be bent in the negative z-axis direction and thereby positioned adjacent to the conductive sheet 460.

When the flexible printed circuit board 440 is bent toward the conductive sheet 460 and positioned adjacent to the conductive sheet 460, the problem of noise coupling between the flexible printed circuit board 440 and the conductive sheet 460 may arise due to the signal component and power component of the flexible printed circuit board 440, thereby deteriorating radio frequency (RF) communication performance. In addition, if the flexible printed circuit board 440 and the conductive sheet 460 are positioned adjacent to each other, the conductive sheet 460 may act as an antenna for emitting electro-magnetic interference (EMI) noise which may interfere with the normal operations of electronic equipment external to the electronic device 400.

When the flexible printed circuit board 440 according to certain embodiments of the disclosure is disposed adjacent to the conductive sheet 460, parasitic capacitance may occur between the flexible printed circuit board 440 and the conductive sheet 460. Parasitic capacitance refers to a capacitance existing between two conductors spaced apart from each other in a high-frequency circuit, and the parasitic capacitance component may degrade operations of the electronic device 400.

The frequency of the coupled noise may be inversely proportional to the parasitic capacitance. For example, as the value of the parasitic capacitance decreases, the frequency value of the coupled noise increases. Also, as the frequency value of the coupled noise increases, a problem caused by noise coupling may be reduced.

The parasitic capacitance value may be inversely proportional to a distance between two spaced conductors. If the distance between the two spaced conductors is increased, the parasitic capacitance value may decrease and the frequency value of the coupled noise may increase. If the distance between the two spaced conductors is increased, the frequency band of the coupled noise may be shifted to a relatively high frequency band, and the issue of noise coupling may be reduced. For example, if the distance between the flexible printed circuit board 440 and the conductive sheet 460 increases, the parasitic capacitance value generated between the flexible printed circuit board 440 and the conductive sheet 460 may decrease. This may increase the frequency value of the coupled noise and thereby attenuate coupling of a noise source from the flexible printed circuit board 440 to the conductive sheet 460.

The insulating member 470 according to certain embodiments of the disclosure forms a gap between the flexible printed circuit board 440 and the conductive sheet 460 and thus increases a distance between the flexible printed circuit board 440 and the conductive sheet 460. The insulating member 470 may have a certain length in the third direction (the z-axis direction). The conductive sheet 460 and the flexible printed circuit board 440 may be spaced apart from each other by the length of the insulating member 470 in the third direction (the z-axis direction).

The insulating member 470 according to certain embodiments of the disclosure may include an insulating material. The insulating material included in the insulating member 470 may prevent the insulating member 470 from electrically affecting other electrical components inside the electronic device 400. For example, the insulating member 470 may be made of rubber, which has insulative properties.

The insulating member 470 according to certain embodiments of the disclosure may have a rectangular parallelepiped shape. However, the insulating member 470 is not limited to a rectangular parallelepiped shape and may be formed in various other shapes such as a spherical shape and a cylindrical shape.

The flexible printed circuit board 440 according to certain embodiments of the disclosure may be bent in a direction toward the first surface 410A of the housing 410. For example, the flexible printed circuit board 440 may be bent in the third direction (the z-axis direction). When the insulating member 470 is disposed on one surface of the flexible printed circuit board 440, the insulating member 470 may apply a force to the flexible printed circuit board 440 through the lower surface thereof (the surface of the insulating member 470 facing toward the z-axis direction). The flexible printed circuit board 440 may receive a force from the insulating member 470 and thereby be bent in the third direction (the z-axis direction).

When the flexible printed circuit board 440 according to certain embodiments of the disclosure is formed to be bent in the third direction (the z-axis direction), the flexible printed circuit board 440 may be positioned adjacent to the first surface 410A of the housing 410. Because the electrical components disposed on the first surface 410A of the housing 410 are grounded, the problem of noise coupling of the flexible printed circuit board 440 with the conductive sheet 460 may be reduced.

Figure 6:
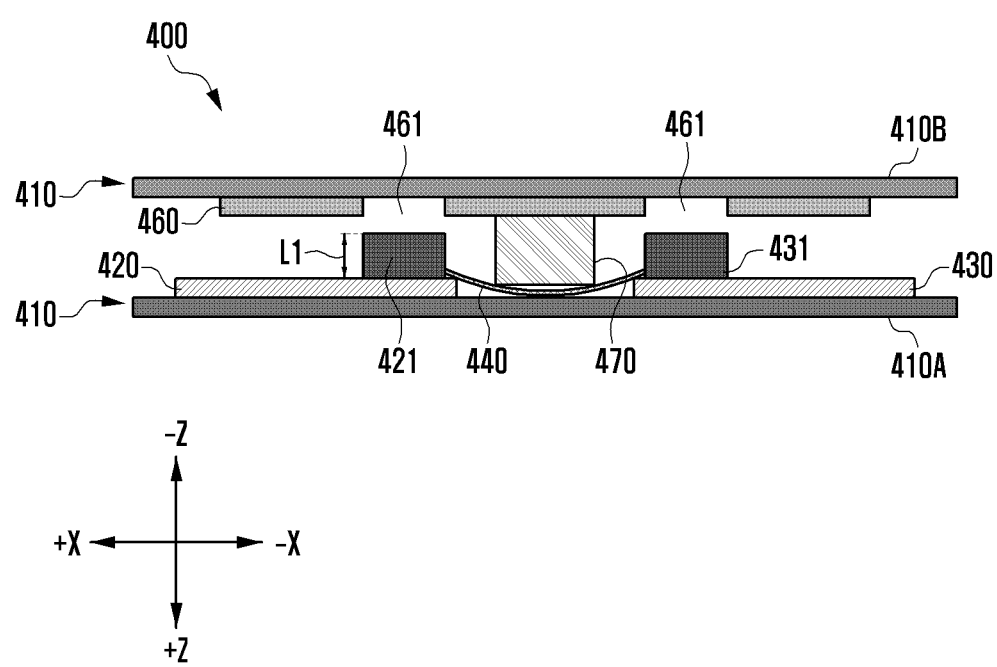
FIG. 6 is a conceptual diagram illustrating an arrangement of an electronic device including a conductive sheet opening according to certain embodiments of the disclosure.

FIG. 6 is a conceptual diagram illustrating an arrangement of an electronic device including a conductive sheet opening 461 according to certain embodiments of the disclosure.

The flexible printed circuit board 440 according to certain embodiments of the present disclosure may be connected to the first printed circuit board 420 at one end thereof and connected to the second printed circuit board 430 at the opposite end thereof. The first and second printed circuit boards 420 and 430 may be electrically connected to each other through a conductive layer (not shown) included in the flexible printed circuit board 440.

According to certain embodiments, the flexible printed circuit board 440 may include a flexible material, and may thus be somewhat bendable.

The insulating member 470 according to certain embodiments of the disclosure is disposed on one surface of the flexible printed circuit board 440 and may the flexible printed circuit board 440 to be bent in the third direction (the z-axis direction).

According to an embodiment, the upper surface of the insulating member 470 (e.g., the surface of the insulating member 470 facing toward the negative z-axis direction) may be disposed at a position overlapping with at least a portion of the conductive sheet opening 461 formed in the conductive sheet 460.

According to certain embodiments, in order to connect the first printed circuit board 420 and the second printed circuit board 430, the flexible printed circuit board 440 may be connected to the first connector 421 at one end thereof and also connected to the second connector 431 at the opposite end thereof. The flexible printed circuit board 440 may be bent in the third direction (e.g., the z-axis direction) between the first connector 421 connected at the one end thereof and the second connector 431 connected at the opposite end thereof.

According to certain embodiments, the first connector 421 may be disposed on one surface of the first printed circuit board 420. The first connector 421 may electrically connect the first printed circuit board 420 and the flexible printed circuit board 440.

According to certain embodiments, the second connector 431 may be disposed on one surface of the second printed circuit board 430. The second connector 431 may electrically connect the second printed circuit board 430 and the flexible printed circuit board 440.

The first connector 421 and the second connector 431 according to certain embodiments of the disclosure may each have a certain height in a direction toward the conductive sheet 460 from one surface of the first and second printed circuit boards 420 and 430. For example, with reference to FIG. 6, the first connector 421 and the second connector 431 may each have a first length L1 in the third direction (e.g., the z-axis direction). The first length L1 of the first and second connectors 421 and 431 may be smaller than a distance by which the first and second printed circuit boards 420 and 430 are spaced apart from the conductive sheet 460 in the third direction (e.g., z-axis direction).

In case of having the first length L1, the first and second connectors 421 and 431 according to certain embodiments of the disclosure may be positioned adjacent to the conductive sheet 460. When the first and second connectors 421 and 431 are positioned adjacent to the conductive sheet 460, the noise caused by the first and second connectors 421 and 431 may be coupling from the first and second connectors 421 and 431 to the conductive sheet 460 and thereby deteriorate the radio frequency (RF) communication performance. In addition, when the first and second connectors 421 and 431 are positioned adjacent to the conductive sheet 460, the conductive sheet 460 may act as an antenna for emitting electro-magnetic interference (EMI) noise and thereby disturb the normal operation of surrounding electronic equipment.

In order to prevent the first and second connectors 421 and 431 from interfering with the conductive sheet 460, the conductive sheet 460 according to certain embodiments of the disclosure may include the conductive sheet opening 461 defined in at least a portion of the conductive sheet 460. The conductive sheet opening 461 may be formed at positions that overlap with the first and second connectors 421 and 431. For example, the first and second connectors 421 and 431 may be positioned under the conductive sheet opening 461 in the third direction (e.g., the z-axis direction).

The conductive sheet 460 according to certain embodiments of the disclosure may have a plurality of conductive sheet openings 461. For example, the conductive sheet 460 may not be limited to having the conductive sheet openings 461 at positions overlapping with the first and second connectors 421 and 431, but also have another conductive sheet opening 461 at a position overlapping with another electrical component that may interfere with the conductive sheet 460.

According to an embodiment, at least a portion of the conductive sheet opening 461 may be disposed to overlap with the insulating member 470.

Figure 7:
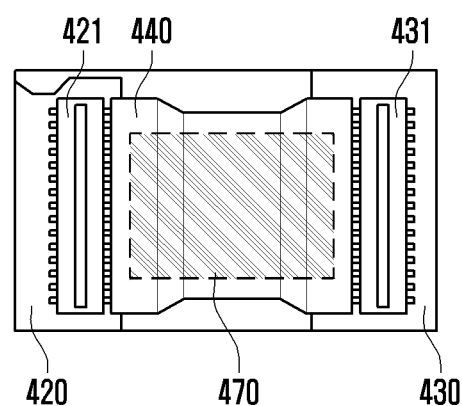
FIG. 7 is a diagram illustrating a state in which an insulating member is disposed on one surface of a flexible printed circuit board according to certain embodiments of the disclosure.

FIG. 7 is a diagram illustrating a state in which an insulating member 470 is disposed on one surface of a flexible printed circuit board 440 according to certain embodiments of the disclosure.

With reference to FIG. 7, the insulating member 470 may be disposed on one surface of the flexible printed circuit board 440.

In certain embodiments, a direction running from one end to the opposite end of the flexible printed circuit board 440 may refer to a lengthwise direction of the flexible printed circuit board 440. A direction perpendicular to the lengthwise direction and running from one side to the opposite side of the flexible printed circuit board 440 may refer to a widthwise direction of the flexible printed circuit board 440. For example, with reference to FIG. 7, the first direction (the x-axis direction) refers to the lengthwise direction of the flexible printed circuit board 440, and the second direction (the y-axis direction) refers to the widthwise direction of the flexible printed circuit board 440.

The insulating member 470 according to certain embodiments of the disclosure may have a length smaller than the length from one end to the opposite end of the flexible printed circuit board 440 in the lengthwise direction of the flexible printed circuit board 440. For example, with reference to FIG. 7, in the first direction (the x-axis direction), the length of the insulating member 470 may be smaller than the length of the flexible printed circuit board 440.

The insulating member 470 according to certain embodiments of the disclosure may have a length smaller than the length from one side to the opposite side of the flexible printed circuit board 440 in the widthwise direction of the flexible printed circuit board 440. For example, with reference to FIG. 7, in the second direction (the y-axis direction), the length of the insulating member 470 may be smaller than the length of the flexible printed circuit board 440.

The insulating member 470 according to certain embodiments of the disclosure may have a rectangular cross-section based on the x-y plane, but the cross-section is not limited thereto and various other shapes are possible.

According to certain embodiments, the first connector 421 may be positioned at one end of the flexible printed circuit board 440, and the second connector 431 may be positioned at the opposite end of the flexible printed circuit board 440. Each length of the first and second connectors 421 and 431 may be equal to the length of the flexible printed circuit board 440 in the widthwise direction. For example, with reference to FIG. 7, in the second direction (the y-axis direction), the flexible printed circuit board 440 and the first and second connectors 421 and 431 may have the same length.

The electronic device according to certain embodiments of the disclosure may be one of various types of electronic devices. The electronic devices may include, for example, a portable communication device (e.g., a smartphone), a computer device, a portable multimedia device, a portable medical device, a camera, a wearable device, or a home appliance. The electronic devices according to embodiments of the disclosure are not limited to those described above.

It should be appreciated that certain embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B", "at least one of A and B", "at least one of A or B", "A, B, or C", "at least one of A, B, and C", and "at least one of A, B, or C" may include any one of, or all possible combinations of the items enumerated together in a corresponding one of the phrases. As used herein, such terms as "$1^{st}$" and "$2^{nd}$" or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with", "coupled to", "connected with", or "connected to" another element (e.g., a second element), it means that the element may be coupled with the other element directly (e.g., wiredly), wirelessly, or via a third element.

As used in connection with certain embodiments of the disclosure, the term "module" may include a unit implemented in hardware, software, or firmware, and may interchangeably be used with other terms, for example, logic, logic block, part, or circuitry. A module may be a single integral component, or a minimum unit or part thereof, adapted to perform one or more functions. For example, according to an embodiment, the module may be implemented in a form of an application-specific integrated circuit (ASIC).

Certain embodiments as set forth herein may be implemented as software (e.g., the program 140) including one or more instructions that are stored in a storage medium (e.g., the internal memory 136 or the external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a compiler or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to certain embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to certain embodiments, each component (e.g., module or program) of the above-described components may include a singular or a plurality of entities, and some of the plurality of entities may be separately disposed in any other component. According to certain embodiments, one or more components or operations among the above-described components may be omitted, or one or more other components or operations may be added. Alternatively or additionally, a plurality of components (e.g., module or program) may be integrated into one component. In this case, the integrated component may perform one or more functions of each component of the plurality of components identically or similarly to those performed by the corresponding component among the plurality of components prior to the integration. According to certain embodiments, operations performed by a module, program, or other component may be executed sequentially, in parallel, repeatedly, or heuristically, or one or more of the operations may be executed in a different order or omitted, or one or more other operations may be added.

What is claimed is:

1. An electronic device, comprising:
   a housing including a first surface, a second surface parallel to the first surface, and a side surface surrounding a space formed between the first surface and the second surface;
   a first printed circuit board (PCB) disposed on the first surface of the housing;
   a second PCB disposed on the first surface of the housing and spaced apart from the first PCB;
   a flexible printed circuit board (FPCB) connecting the first PCB and the second PCB;
   a conductive sheet disposed on the second surface of the housing and spaced apart from the first PCB, the second PCB, and the FPCB; and
   an insulating member disposed on one surface of the FPCB and contacting the conductive sheet.

2. The electronic device of claim 1, further comprising:
   a first connector connecting the FPCB and the first PCB; and
   a second connector connecting the FPCB and the second PCB.

3. The electronic device of claim 2, wherein the conductive sheet includes an opening formed at a position overlapping with the first and second connectors.

4. The electronic device of claim 3, wherein the conductive sheet includes a plurality of openings.

5. The electronic device of claim 1, wherein the insulating member has a rectangular parallelepiped shape.

6. The electronic device of claim 1, wherein the insulating member includes at least rubber.

7. The electronic device of claim 1, wherein the FPCB is bent towards the first surface of the housing.

8. The electronic device of claim 1, wherein the insulating member includes a length smaller than a length of the FPCB.

9. The electronic device of claim 1, wherein the insulating member includes a length smaller than a width of the FPCB.

10. The electronic device of claim 1, wherein the first PCB includes a communication module disposed thereon, and the second PCB includes a central processing unit disposed thereon.

11. The electronic device of claim 10, wherein a length of the first PCB is smaller than a length of the second PCB.

12. The electronic device of claim 1, wherein a width of the FPCB is smaller than respective lengths of the first and second PCBs.

13. An electronic device, comprising:
   a housing;
   a first printed circuit board (PCB);
   a second PCB spaced apart from the first PCB;
   a flexible printed circuit board (FPCB) connecting the first PCB and the second PCB;
   a conductive sheet disposed on a surface of the housing and dissipating a heat of the first PCB and the second PCB through heat diffusion; and
   an insulating member disposed between the FPCB and the conductive sheet to contact with at least one of the FPCB or the conductive sheet,
   wherein the conductive sheet is spaced apart from the first PCB, the second PCB, and the FPCB.

14. The electronic device of claim 13, further comprising:
a first connector connecting the FPCB and the first PCB; and
a second connector connecting the FPCB and the second PCB.

15. The electronic device of claim 14, wherein the conductive sheet includes an opening formed at a position overlapping with the first and second connectors.

16. The electronic device of claim 13, wherein the insulating member is disposed in plural on a surface of the FPCB.

17. The electronic device of claim 13, wherein the insulating member includes at least rubber.

18. The electronic device of claim 13, wherein the FPCB is bent towards a surface of the housing.

19. The electronic device of claim 13, wherein the insulating member has a length smaller than a length of the FPCB.

20. The electronic device of claim 13, wherein the insulating member includes a length smaller than a width of the FPCB.

* * * * *